(12) United States Patent
Sasaki

(10) Patent No.: US 11,224,921 B2
(45) Date of Patent: Jan. 18, 2022

(54) COATED CUTTING TOOL

(71) Applicant: Mitsubishi Hitachi Tool Engineering, Ltd., Tokyo (JP)

(72) Inventor: Tomoya Sasaki, Yasu (JP)

(73) Assignee: MOLDINO Tool Engineering, Ltd., Tokyo (JP)

(*) Notice: Subject to any disclaimer, the term of this patent is extended or adjusted under 35 U.S.C. 154(b) by 12 days.

(21) Appl. No.: 16/630,934

(22) PCT Filed: Sep. 19, 2018

(86) PCT No.: PCT/JP2018/034600
§ 371 (c)(1),
(2) Date: Jan. 14, 2020

(87) PCT Pub. No.: WO2019/065397
PCT Pub. Date: Apr. 4, 2019

(65) Prior Publication Data
US 2020/0230705 A1    Jul. 23, 2020

(30) Foreign Application Priority Data
Sep. 27, 2017    (JP) ............................. JP2017-185677

(51) Int. Cl.
*B23B 27/14* (2006.01)
*B23C 5/16* (2006.01)
(Continued)

(52) U.S. Cl.
CPC ............... *B23B 27/14* (2013.01); *B23C 5/16* (2013.01); *C23C 14/0641* (2013.01); *C23C 14/34* (2013.01)

(58) Field of Classification Search
CPC ......... B23B 27/14; B23B 27/148; C23C 5/15; C23C 14/0641
(Continued)

(56) References Cited

U.S. PATENT DOCUMENTS 8,709,593 B2 *   4/2014   Chang ................. C23C 14/022
                                                      428/699
2006/0263582 A1 *  11/2006  Flink ................. C23C 14/0641
                                                      428/216
(Continued)

FOREIGN PATENT DOCUMENTS

CN          105112858 A      12/2015
EP            3437774 A1      2/2019
(Continued)

OTHER PUBLICATIONS

Yuan et al "Relationship of microstructure, mechanical properties and hardened steel cutting performance of TiSiN-based nanocomposite coated tool" Journal of Manufacturing Processes 28 p. 399-409. (Year: 2017).*

(Continued)

*Primary Examiner* — Archene A Turner
(74) *Attorney, Agent, or Firm* — Locke Lord LLP

(57) ABSTRACT

Provided is a coated cutting tool that has a nitride hard coating that contains Ti at 70 at % to 95 at % and Si at 5 at % to 30 at % with respect to the total amount of metallic elements, and Ar at 0.05 at % to 0.20 at % with respect to the total amount of metallic and non-metallic elements, has a NaCl-type crystalline structure, exhibits maximum diffraction peak intensity in the (200) plane, and has an average grain size of 5 nm to 30 nm. When 100 at % is defined as the total of content rates of the metallic elements, nitrogen, oxygen, and carbon in a composition at intervals of 20 nm from a depth of 20 nm to 200 nm from a surface of the hard coating, the content rate of nitrogen is 50.0 at % or more.

8 Claims, 3 Drawing Sheets

(51) Int. Cl.
*C23C 14/06* (2006.01)
*C23C 14/34* (2006.01)

(58) Field of Classification Search
USPC .................. 51/307, 309; 428/697, 698, 699
See application file for complete search history.

(56) References Cited

U.S. PATENT DOCUMENTS

| | | | |
|---|---|---|---|
| 2006/0292399 A1* | 12/2006 | Sjolen | C23C 14/0021 428/698 |
| 2009/0016831 A1* | 1/2009 | Sundstrom | C22C 29/08 428/336 |
| 2016/0068449 A1 | 3/2016 | Tsukihara et al. | |
| 2016/0177436 A1 | 6/2016 | Kurapov et al. | |
| 2017/0266733 A1 | 9/2017 | Sato et al. | |
| 2020/0298316 A1* | 9/2020 | Sasaki | C23C 14/024 |

FOREIGN PATENT DOCUMENTS

| | | |
|---|---|---|
| JP | 2000-334606 A | 12/2000 |
| JP | 2002-096206 A | 4/2002 |
| JP | 2008-080447 A | 4/2008 |
| JP | 2011-093085 A | 5/2011 |
| JP | 2012-045650 A | 3/2012 |
| JP | 2015-033757 A | 2/2015 |
| JP | 2015-123530 A | 7/2015 |
| JP | 2016-084505 A | 5/2016 |
| JP | 2016-084506 A | 5/2016 |
| JP | 2016-107396 A | 6/2016 |
| JP | 2016-534217 A | 11/2016 |
| WO | 2017/170536 A1 | 10/2017 |

OTHER PUBLICATIONS

Chang et al "Microstructure, corrosion and tribological behaviors of TiAlSiN coatigns deposited by cathodic arc plasma deposition" Thin Solid Films 517 p. 5231-5236. (Year: 2009).*
Nose et al "Influence of sputtering conditions on the structure and properties of Ti—Si—N thin films prepared by r.f.—reactive sputtering" Surface and Coatings Technologies 174-175 p. 261-265. (Year: 2003).*
Supplementary European Search Report dated Feb. 16, 2021, issued for European Patent Application No. 18861288.1.
International Search Report dated Dec. 18, 2018, issued for PCT/JP2018/034600 and English translation thereof.
S. Li et al., "Effects of Ti target current on properties of TiSiN coatings", Surface Engineering, vol. 33, No. 8, Jan. 12, 2016, pp. 578-584 and cover page. (cited in the Aug. 5, 2020 Office Action issued for CN201880048108.4).
Office Action dated Aug. 5, 2020, issued for Chinese Patent Application No. 201880048108.4 and English translation thereof.

* cited by examiner

COATED CUTTING TOOL

TECHNICAL FIELD

The present invention relates to a coated cutting tool having a hard coating on a surface thereof.

Priority is claimed on Japanese Patent Application No. 2017-185677, filed on Sep. 27, 2017, the contents of which are incorporated herein by reference.

BACKGROUND ART

Conventionally, as technology for improving a lifespan of a tool such as a cutting tool, surface treatment technology for coating a surface of the tool with a hard coating formed of various ceramics is adopted. A composite nitride coating of titanium (Ti) and silicon (Si) in the hard coating (hereinafter, the composite nitride coating of Ti and Si may be called "TiSiN") has excellent wear resistance. For this reason, the cutting tools on which these hard coatings are formed exhibit excellent durability in cutting machining of, for instance, high hardness steel.

As a cutting tool coated with a nitride coating, a coated cutting tool coated with, for instance, TiSiN that has a compound phase in which silicon nitride ($Si_3N_4$) and Si exist as independent phases (e.g., see Patent Document 1). Further, a coated cutting tool coated with TiSiN in which fine crystal grains and amorphous phases are mixed in a microstructure is known (e.g., see Patent Document 2).

CITATION LIST

Patent Document

[Patent Document 1]
Japanese Unexamined Patent Application, First Publication No. 2000-334606
[Patent Document 2]
Japanese Unexamined Patent Application, First Publication No. 2008-80447

SUMMARY OF INVENTION

Technical Problem

Since the existing TiSiN coating contains many amorphous phases and in which fully nitrided phases is not sufficiently formed, the existing TiSiN coating has low crystallinity. The inventors of the invention determined through investigations that, in a tool coated with the existing TiSiN under a severe usage environment in which a load on the tool is high, for instance, in which high hardness steel having a Rockwell hardness (HRC) of 50 or more is machined with high efficiency, damage to the tool may become large, and there is room for improvement.

This invention was made in view of the above circumstances, and is directed to providing a coated cutting tool that improves heat resistance and wear resistance of a nitride coating composed mainly of Ti and Si and is excellent in durability.

Solution to Problem

According to an aspect of the present invention, a coated cutting tool is a cutting tool having a hard coating on a surface thereof, in which the hard coating is a nitride, contains titanium (Ti) at 70 at % or more and 95 at % or less and silicon (Si) at 5 at % or more and 30 at % or less with respect to a total amount of metallic elements (including metalloid elements), and argon (Ar) at 0.05 at % or more and 0.20 at % or less with respect to a total amount of metallic elements (including metalloid elements) and non-metallic elements, the hard coating has a NaCl type crystal structure, exhibits maximum diffraction peak intensity in the (200) plane due to the NaCl type crystal structure, and has an average grain size of 5 nm or more and 30 nm or less, when 100 at % is defined as the total of content rates of metallic elements (including metalloid elements), nitrogen, oxygen, and carbon in a composition at intervals of 20 nm from a depth of 20 nm to a depth of 200 nm from the surface of the hard coating, the content rate of nitrogen is 50.0 at % or more, and a flank of the coated cutting tool has an arithmetic mean height (Sa) of 0.1 μm or less, a maximum height (Sz) of 2.0 μm or less, and an arithmetic mean peak curvature (Spc) (1/mm) value of 5,000 or less, all of which are as defined by ISO 25178.

Preferably, the flank does not have nearly parallel grinding marks formed in a constant direction.

An intermediate coating is preferably provided between the tool and the hard coating.

A value of skewness (Ssk) as defined by ISO 25178 is preferably −4.0 or more and 0 or less in the flank.

Advantageous Effects of Invention

According to the present invention, an excellent coated cutting tool in which, in the hard coating that contains a nitride composed mainly of Ti and Si provided on a surface of the coated cutting tool, a structure of the hard coating is controlled on a microlevel, a content rate of nitrogen is raised in a thickness direction of the coating, and thus durability of the coated cutting tool is improved can be provided.

DESCRIPTION OF EMBODIMENTS

Figure 1:
FIG. 1 is an example of a surface observation photograph by a laser microscope (at a magnification of 50) in Example 3.

The inventors of the present invention investigated techniques for improving heat resistance and wear resistance in a nitride composed mainly of Ti and Si. The inventors found that oxygen or carbon is contained in a nitride that is mainly composed of Ti and Si and is coated by a conventional arc ion plating method on a level of several at %, a content rate of nitrogen contained in a hard coating is apt to be reduced with respect to content rates of metallic elements, and as a result, it is difficult for fully nitrided phases to be sufficiently formed. The inventors found that controlling a coating structure on a microlevel in a nitride composed mainly of Ti and Si, raising a content rate of nitrogen in a thickness direction of the coating, and furthermore controlling surface roughness are efficient for improving durability of a coated cutting tool.

Hereinafter, details of embodiments of the present invention will be described.

A coated cutting tool of the present embodiment is a coated cutting tool having a hard coating that contains a nitride composed mainly of Ti and Si on a surface of the tool.

Details of a component composition, a structure, and characteristics of the hard coating constituting the coated cutting tool of the present embodiment, and a method of manufacturing the hard coating will be described.

[1] Hard Coating

<Component Composition (Titanium (Ti) and Silicon (Si))>

A hard coating according to the present embodiment is a nitride composed mainly of Ti and Si. The nitride composed mainly of Ti and Si contains a certain amount of Si, and thereby a structure of the hard coating is made fine, and heat resistance and hardness are enhanced. Further, the hard coating according to the present embodiment has high residual compressive stress and is applied to a coated cutting tool, and thereby durability of the cutting tool is improved.

In the following description, when simply the "content rate of Si" and "content rate of Ti" are mentioned, it refers to the "content rate of Si in the hard coating" and "content rate of Ti in the hard coating," respectively.

To improve the heat resistance and the hardness of the hard coating and impart adequate residual compressive stress to the hard coating, the hard coating according to the present embodiment contains Si at 5 at % or more with respect to the total amount of metallic elements (including metalloid elements; the same below). On the other hand, if the content rate of Si increases excessively, amorphous phases contained in the hard coating increase, and durability of the coated cutting tool is lowered. For this reason, the hard coating according to the present embodiment contains Si at 30 at % or less with respect to the total amount of metallic elements. A preferred lower limit of the content rate of Si is 10 at %. Further, a preferred upper limit of the content rate of Si is 25 at %.

Further, in a case where the content rate of Ti is small, the wear resistance or the heat resistance of the hard coating is apt to be reduced. For this reason, to enable the hard coating to have both the wear resistance and the heat resistance on a high level, the hard coating according to the present embodiment contains Ti at 70 at % or more with respect to the total amount of metallic elements. On the other hand, if the content rate of Ti increases excessively, the content rate of Si is relatively reduced, which causes a coating structure to become coarse, and it is difficult to impart sufficient residual compressive stress to the hard coating. Therefore, to finely control the structure of the hard coating to impart adequate residual compressive stress, the hard coating according to the present embodiment contains Ti at 95 at % or less with respect to the total amount of metallic elements. A preferred lower limit of the content rate of Ti is 75 at %. Further, a preferred upper limit of the content rate of Ti is 90 at %.

As long as the hard coating according to the present embodiment contains Ti and Si within the aforementioned ranges, the hard coating may contain other metallic elements. Even in the case where the hard coating contains other metallic elements, in the hard coating according to the present embodiment, when all metallic elements are defined as 100 at %, the total of the content rates of Ti and Si is preferably more than or equal to 90 at %.

The content rates of the metallic elements of the hard coating according to the present embodiment can be measured for the hard coating subjected to specular working using an electron probe micro-analyzer (EPMA). In this case, for example, the content rate of each of the metallic elements can be obtained from an average of the obtained measured values obtained by performing specular working on a hard coating surface and then performing 5-point analysis on an analysis range having a diameter of about 1 µm.

If a thickness of the hard coating is excessively thinned, the wear resistance of the coated cutting tool is apt to be lowered. Further, if the thickness of the hard coating is excessively thickened, the hard coating is easily peeled. For this reason, the thickness of the hard coating according to the present embodiment is preferably 0.3 µm or more and 5.0 µm or less. More preferably, the thickness of the hard coating is 0.5 µm or more and 3.0 µm or less.

<Component Composition (Argon (Ar))>

The hard coating according to the present embodiment contains argon (Ar) at a amount of 0.05 at % or more and 0.20 at % or less with respect to the total amount of metallic elements (including metalloid elements) and non-metallic elements (the entire hard coating).

In a sputtering method, the hard coating is coated by sputtering a target using argon ions, and thus the hard coating is likely to contain argon. As will be described below, if a grain size of the hard coating is atomized, hardness is enhanced. On the other hand, if the grain size of the hard coating is atomized, grain boundaries become many, and argon contained in the hard coating is concentrated on the grain boundaries. If the content rate of argon of the hard coating increases excessively, toughness of the hard coating is lowered, and sufficient tool performance is not easily produced. For this reason, in the present embodiment, to reduce the argon concentrated on the grain boundaries of the hard coating to obtain an effect of atomizing the hard coating (to be described below), the hard coating according to the present embodiment contains the argon at a amount of 0.20 at % or less. Furthermore, the hard coating according to the present embodiment preferably contains argon at a amount of 0.15 at % or less. Moreover, the hard coating according to the present embodiment preferably contains argon at a amount of 0.10 at % or less. Since the hard coating according to the present embodiment is coated by a sputtering method, the hard coating can contain the argon at a amount of 0.05 at % or more. For this reason, in the hard coating according to the present embodiment, a lower limit of the content rate of the argon is 0.05 at %.

Like the aforementioned measurement of the content rates of the metallic elements, the content rate of argon of the hard coating according to the present embodiment can be measured for the hard coating subjected to specular working using the electron probe micro-analyzer (EPMA). Like the aforementioned measurement of the content rates of the metallic elements, the content rate of each of the metallic elements can be obtained from an average of the obtained measured values obtained by performing specular working on the hard coating surface and then performing 5-point analysis on an analysis range having a diameter of about 1 µm.

Aside from nitrogen, the hard coating according to the present embodiment may contain argon, oxygen, and carbon as the non-metallic elements at a minute content. The content rate of argon of the hard coating according to the present embodiment can be obtained by defining 100 at % as the content rates of metallic elements (including metalloid elements), nitrogen, oxygen, carbon, and argon.

<Crystal Structure>

The hard coating according to the present embodiment is a NaCl type crystal structure, that is, a face-centered cubic structure (an fcc structure). In the present embodiment, the hard coating being the NaCl type crystal structure means that a diffraction peak intensity resulting from the NaCl type crystal structure exhibits a maximum intensity in X-ray diffraction or a selected area diffraction pattern using a transmission electron microscope (TEM). For this reason, if the diffraction peak intensity resulting from the NaCl type crystal structure as the entire hard coating exhibits the maximum intensity, even if the hard coating partly contains a hexagonal close-packed structure (an hcp structure) or an amorphous phase in a microanalysis using the transmission electron microscope (TEM), the hard coating is the NaCl type crystal structure. On the other hand, since the hard coating in which a diffraction peak intensity resulting from the hcp structure is a maximum intensity is brittle, durability is apt to be reduced if the hard coating is applied to the coated cutting tool. The crystal structure of the hard coating according to the present embodiment can be checked in the X-ray diffraction or the selected area diffraction pattern using the transmission electron microscope (TEM). In a case where an area to be tested in the hard coating is small, identification of the NaCl type crystal structure by the X-ray diffraction may be difficult. Even in this case, the identification of the crystal structure can be performed, for instance, by the selected area diffraction pattern using the transmission electron microscope (TEM).

In the hard coating according to the present embodiment, a (200)-plane diffraction peak intensity resulting from the NaCl type crystal structure exhibits a maximum intensity. The (200)-plane diffraction peak intensity exhibits the maximum intensity, and thereby the hard coating according to the present embodiment exhibits excellent durability compared to the other diffraction peak intensities. In a case where the (200)-plane diffraction peak intensity resulting from the NaCl type crystal structure is defined as I(200) and a (111)-plane diffraction peak intensity is defined as I(111), I(200)/I(111) is preferably more than or equal to 3. More preferably, I(200)/I(111) is more than or equal to 4. Further preferably, I(200)/I(111) is more than or equal to 5.

In the hard coating according to the present embodiment, a diffraction intensity or a diffraction pattern resulting from the hcp structure is preferably not confirmed in crystal analysis using the X-ray diffraction or the transmission electron microscope (TEM).

<Average Grain Size>

The hard coating according to the present embodiment has an average grain size of 5 nm or more and 30 nm or less. If a microstructure of the hard coating becomes too fine, a structure of the hard coating becomes close to an amorphous structure, and thus toughness and hardness of the hard coating are reduced. To improve crystallinity of the hard coating to reduce brittle amorphous phases, the average grain size of the hard coating is set to 5 nm or more. Further, if the microstructure of the hard coating becomes too coarse, the hardness of the hard coating is reduced, and thus the durability of the coated cutting tool is apt to be reduced. To improve the durability of the coated cutting tool by imparting high hardness to the hard coating, the average grain size of the hard coating is set to 30 nm or less. The average grain size of the hard coating is more preferably 20 nm or less.

The average grain size of the hard coating according to the present embodiment is measured from full-width at half maximum of a diffraction peak in the (200) plane that exhibits the maximum intensity by the X-ray diffraction.

<Component Composition (Nitrogen (N), Oxygen (O), and Carbon (C))>

The hard coating according to the present embodiment is a nitride, but may contain oxygen and carbon in addition to argon described above at a minute content.

A coating composition of the hard coating can be accurately measured in a coating thickness direction by sequentially analyzing the coating composition from a surface of the hard coating using a scanning X-ray photoelectron spectroscope. In the present embodiment, a nitride of Ti and Si coated by a conventional arc ion plating method is evaluated using the scanning X-ray photoelectron spectroscope. The inventors of the invention found that, in the case where the nitride is coated by the conventional arc ion plating method, the nitride inevitably contains oxygen and carbon at a constant content, a content rate of the element nitrogen with respect to metallic elements is low, and it is difficult for fully nitrided phases to be sufficiently formed. In a case where the nitride is not sufficiently formed all over the hard coating, the microstructure and the composition of the hard coating can easily become non-uniform, and the durability of the coated cutting tool is apt to be reduced.

In a case where the composition of the hard coating according to the present embodiment is analyzed at intervals of 20 nm from a depth of 20 nm to 200 nm from the surface of the hard coating using the scanning X-ray photoelectron spectroscope and, as a result of analyzing the composition, the total of the content rates of metallic elements (including metalloid elements), nitrogen, oxygen, and carbon in the composition at each depth position is defined as 100 at %, a content rate of nitrogen is 50.0 at % or more. By raising the content rate of nitrogen contained in the hard coating in a coating thickness direction, heat resistance of the hard coating can be improved by forming a sufficient nitride in the entire hard coating. Especially, when the content rate of nitrogen is 50.0 at % or more, the sufficient nitride is formed in the entire hard coating, and the heat resistance of the hard coating is apt to be improved.

In the analyzing method of the hard coating according to the present embodiment, the composition analysis is performed on the hard coating every etching step from a depth of 20 nm to 200 nm from the surface of the hard coating, and a range from the surface of the hard coating to a depth of 200 nm is subjected to the composition analysis. In the composition analysis, the total of the content rates of metallic elements (including metalloid elements), nitrogen, oxygen, and carbon is defined as 100 at %, and the content rate of each element is calculated. Since oxygen and carbon that are inevitable impurities are detected more on the outermost surface of the hard coating, the analysis is performed from a position at which the depth from the surface of the hard coating is 20 nm.

In a case where the composition of the hard coating according to the present embodiment is analyzed at intervals of 20 nm from a depth of 20 nm to 200 nm from the surface of the hard coating using the scanning X-ray photoelectron spectroscope and, as a result of analyzing the composition, the total of the content rates of metallic elements (including metalloid elements), nitrogen, oxygen, and carbon in the composition is defined as 100 at %, a content rate of nitrogen is preferably 51.0 at % or more. However, if the content rate of nitrogen exceeds 55.0 at %, residual compressive stress of the hard coating becomes too high, and self-fracture of the hard coating is easily caused. For this reason, the content rate of nitrogen is preferably 55.0 at % or less.

If the coating composition of the hard coating is analyzed in a coating thickness direction using the scanning X-ray photoelectron spectroscope, oxygen and carbon that are inevitable impurities are detected more on the outermost surface of the hard coating. For this reason, in the analyzing method of the hard coating according to the present embodiment, the composition analysis is performed away from the outermost surface of the hard coating from the position at which the depth from the surface of the hard coating is 20 nm at intervals of 20 nm. If a desired composition range is satisfied in at least a depth from the surface of the hard coating to 200 nm regarding nitrogen, oxygen, and carbon, a nitride that is sufficiently formed at a certain thickness of the coating and is mainly composed of Ti and Si can be considered to be formed. For this reason, the hard coating that produces the effects of the present invention can be specified by the above analyzing method.

In the hard coating according to the present embodiment, the content rate of oxygen is preferably 3 at % or less in the composition at intervals of 20 nm from a depth of 20 nm to 200 nm from the surface of the hard coating. More preferably, the content rate of oxygen is 2 at % or less. Because the content rate of oxygen contained in the hard coating is extremely reduced, the crystallinity of the hard coating is apt to be enhanced.

The hard coating according to the present embodiment preferably has a region in which the content rate of oxygen is 1.5 at % or less in a range within 100 nm from the surface of the hard coating. Because a region in which the content rate of oxygen is as small as 1.5 at % or less is provided at a surface portion of the hard coating (in a range within 100 nm from the surface of the hard coating), the heat resistance of the hard coating is apt to be further enhanced. In the hard coating according to the present embodiment, the content rate of oxygen is apt to be small, but a degree to which oxygen bonded with silicon or titanium is in the hard coating is present.

In the case where the total of the content rates of metallic elements (including metalloid elements), nitrogen, oxygen, and carbon in the composition of the hard coating according to the present embodiment at intervals of 20 nm from a depth of 20 nm to 200 nm from the surface of the hard coating is defined as 100 at %, the content rate of carbon is preferably 5 at % or less. In the composition of the hard coating according to the present embodiment at intervals of 20 nm from a depth of 20 nm to 200 nm from the surface of the hard coating, the content rate of carbon is more preferably 4 at % or less. In addition to the content rate of oxygen that is inevitably contained in the hard coating, the content rate of carbon is also reduced, and thereby the heat resistance of the hard coating is apt to be further improved.

In the case where the total of the content rates of metallic elements (including metalloid elements), nitrogen, oxygen, and carbon in the composition of the hard coating according to the present embodiment at intervals of 20 nm from a depth of 20 nm to 200 nm from the surface of the hard coating is defined as 100 at %, the total of the content rates of oxygen and carbon is preferably 3 at % or less. In the composition of the hard coating according to the present embodiment at intervals of 20 nm from a depth of 20 nm to 200 nm from the surface of the hard coating, the total of the content rates of oxygen and carbon is more preferably 2 at % or less. Because the total of the content rates of oxygen and carbon contained in the hard coating is restricted along with the content rate of oxygen contained in the hard coating and the content rate of carbon contained in the hard coating, the heat resistance of the hard coating is apt to be more improved.

As for the coated cutting tool coated with the hard coating that contains the aforementioned nitride composed mainly of Ti and Si, the surface is further smoothened, and thereby a wear width is reduced, and sudden breakage is easily curbed. The inventors of the invention found that, since a variation in tool performance is great even if the arithmetic mean roughness Ra or maximum height roughness Rz that is surface roughness in general line evaluation is made smooth, it is important to control the surface roughness in wider surface evaluation. The inventors of the invention found that it is effective to control an arithmetic mean peak curvature Spc in addition to an arithmetic mean height Sa and a maximum height Sz as defined by ISO 25178 for surface evaluation. Here, the arithmetic mean peak curvature Spc is an index of a degree to which a peak is sharp. If a value of the arithmetic mean peak curvature Spc is small, this represents a state in which a peak abutting another object is round. If a value of the arithmetic mean peak curvature Spc is great, this represents a state in which a peak abutting another object is sharp. In a flank of the coated cutting tool, by making the value of the arithmetic mean peak curvature Spc smaller, "sharpness" of a surface of the flank becomes smaller, and wear of the flank is more easily curbed.

In the coated cutting tool according to the present embodiment, after the arithmetic mean height Sa as defined by ISO 25178 in the flank is set to 0.1 μm or less and the maximum height Sz as defined by ISO 25178 in the flank is set to 2.0 μm or less, the value of the arithmetic mean peak curvature Spc (1/mm) is set to 5000 or less. In the flank of the coated cutting tool, if the arithmetic mean height Sa is set to 0.1 μm or less and the maximum height Sz is set to 2.0 μm or less, a surface of the flank becomes smooth. Furthermore, in the flank of the coated cutting tool, if the value of the arithmetic mean peak curvature Spc (1/mm) is set to 5000 or less, the "sharpness" of the surface of the flank becomes smaller, and the wear of the flank is more easily curbed. To achieve this surface state, after the tool is coated with a hard coating by a sputtering method, wet blasting treatment or edge treatment of jetting, for instance, a polishing agent is preferably performed.

Furthermore, in the coated cutting tool according to the present embodiment, a value of skewness (Ssk) as defined by ISO 25178 in the flank is preferably set to −4.0 or more and 0 or less. The skewness (Ssk) is an index that indicates height distribution relativity. If there are many droplets on the hard coating, protrusions become many, and the value of the skewness (Ssk) is greater than 0. On the other hand, if there are many recesses in the hard coating, the value of the skewness (Ssk) is smaller than 0. If the hard coating having many droplets is polished, the protrusions are polished, and the value of the skewness (Ssk) is also smaller than 0. However, large recesses are formed by removing the droplets, and the value of the skewness (Ssk) becomes great toward a negative side. The value of the skewness (Ssk) is set to −4.0 or more and 0 or less, and the surface of the flank is preferably brought into a surface state in which it has fewer irregularities and is smoother. Further, the value of the skewness (Ssk) is more preferably set to −2.0 or more and 0 or less. To achieve this surface state, after the tool is coated with a hard coating by a sputtering method, wet blasting treatment or edge treatment is preferably performed by jetting, for instance, a polishing agent.

These roughnesses of the flank of the coated cutting tool relate to the surface of the hard coating formed on the flank.

In the coated cutting tool according to the present embodiment, the roughness of the flank is observed with a cutoff value of 0.25 mm at a magnification of 50 using a shape analysis laser microscope (VK-X250) that is available from KEYENCE Co., Ltd., and can be obtained from an average of measurement values obtained by measuring three regions of 60 μm×100 μm.

Even in the smooth surface state in which the aforementioned surface roughness is achieved, grinding marks may be seen in the microscope observation. Since the grinding marks are formed when the flank is processed by a grindstone, the grinding marks are generally formed on the entire flank nearly in parallel in a constant direction.

In the coated cutting tool according to the present embodiment, the flank preferably does not have the nearly parallel grinding marks formed in the constant direction. Thus, an effect of further curbing destruction of the hard coating is enhanced. To achieve this surface state, before the tool is coated with a hard coating by a sputtering method, wet blasting treatment or edge treatment is preferably performed on the flank by jetting, for instance, a polishing agent.

<Droplets>

If coarse droplets are included in the hard coating, the destruction of the hard coating starting from the droplets easily occurs, and durability of the coated cutting tool is reduced. Especially, if there are many coarse droplets having an equivalent circle diameter of 1.0 μm or more on or in the hard coating, there is a tendency for sudden breakage or the like to easily occur, and the durability of the coated cutting tool is reduced. Further, if many coarse droplets are included in the coating even by making only the coating surface smooth, coating destruction starting from these droplets easily occurs. For this reason, in the observation of the surface and a cross section of the hard coating, there are preferably no droplets having an equivalent circle diameter of 2.0 μm or more, and there are preferably five or fewer droplets having an equivalent circle diameter of 1.0 μm or more per 100 μm$^2$. By reducing the coarse droplets located on the surface of the hard coating, sudden breakage of the coated cutting tool can be curbed. Furthermore, in the observation of the surface and the cross section of the hard coating, there are preferably three or fewer droplets having an equivalent circle diameter of 1.0 μm or more per 100 μm$^2$.

To evaluate the droplets in the observation of the surface and the cross section of the hard coating, after the hard coating is subjected to specular working, a surface that is processed by a focused ion beam method and is subjected to specular working is observed in a plurality of visual fields at a magnification of 5,000 to 10,000 using a transmission electron microscope. Further, the number of droplets on the surface of the hard coating can be obtained by observing the surface of the hard coating using, for instance, a scanning electronic microscope (SEM).

<Other Added Elements>

The hard coating according to the present embodiment may contain metallic elements other than Ti and Si. For example, with the aim of improvement of wear resistance or heat resistance of the hard coating, at least one element selected from the group consisting of group 4a elements of the periodic table, group 5a elements of the periodic table, group 6a elements of the periodic table, boron (B), and yttrium (Y) may be contained in the hard coating. In a case where the total of content rates of metallic elements (including metalloid elements), nitrogen, oxygen, and carbon is set to 100 at % in the hard coating, a content rate of the at least one element selected from the group consisting of group 4a elements of the periodic table, group 5a elements of the periodic table, group 6a elements of the periodic table, boron (B), and yttrium (Y) is preferably 5 at % or less.

<Intermediate Coating or the Like>

In the coated cutting tool according to the present embodiment, to further improve adhesion of the hard coating, an intermediate coating may be separately provided between the tool and the hard coating, more particularly between a base of the tool and the hard coating as needed. For example, a coating containing one of a metal, a nitride, a carbonitride, and a carbide may be provided between the base of the tool and the hard coating. Especially, a coating containing a nitride of Al and Ti is preferably provided as the intermediate coating.

Further, a gradient coating mixed with another hard coating having a different component ratio may be provided between the hard coating according to the present embodiment and the base of the tool. A hard coating having a component ratio or a composition that is different from that of the hard coating according to the present embodiment may be separately formed on the hard coating according to the present embodiment. Furthermore, the hard coating according to the present embodiment and a hard coating having a component ratio or a composition that is different from that of the hard coating according to the present embodiment may be mutually laminated.

[2] Method of Forming Hard Coating

To coat the tool (the base of the tool) with the hard coating according to the present embodiment, a sputtering method of sputtering a target component to form a hard coating among physical vapor deposition methods may be preferably applied.

The physical vapor deposition method has a tendency to impart residual compressive stress to a hard coating and has excellent breakage resistance. Among the physical vapor deposition methods, an arc ion plating method is widely applied because an ionization rate of a target component tends to be high and adhesion of a hard coating tends to be excellent. However, since a target is melted by arc discharge, the arc ion plating method has a tendency for inevitable impurities of oxygen or carbon included in a furnace to be easily taken into the hard coating, and a hard coating having a high content rate of nitrogen is not easily obtained.

Accordingly, the sputtering method in which a target is not melted is applied, thereby having a tendency to reduce inevitable impurities of oxygen or carbon contained in a hard coating. However, in a conventional DC sputtering method or a high-power sputtering method of merely applying high electric power to a target, since an ionization rate of a target component is low, a nitride is not sufficiently formed in the hard coating. For this reason, when the target to which the electric power is applied by applying a sputtering method of applying the electric power to the target in turn among the sputtering methods is replaced, a time for which the electric power is simultaneously applied to both a target in which the application of the electric power is terminated and a target in which the application of the electric power is initiated is preferably provided.

In this sputtering method, there is a tendency for a state in which the ionization rate of the target component is high in coating of the tool with the hard coating to be maintained during coating formation, for crystallinity of the hard coating to become high, and for a sufficient nitride to be formed.

Further, to sufficiently form the nitride in the hard coating by the sputtering method, a maximum power density of electric power pulses is preferably set to 1.0 kW/cm$^2$ or more. However, if a power density applied to a target increases excessively, coating formation is not easily made stable. For this reason, the maximum power density of electric power pulses is preferably set to 3.0 kW/cm² or less. Further, in a case where a time for which the electric power is simultaneously applied to both an alloy target in which the application of the electric power is terminated and an alloy target in which the application of the electric power is initiated is too short or too long, ionization of the target is not sufficient, and a nitride is not easily formed in a hard coating. For this reason, the time for which the electric power is simultaneously applied to both an alloy target in which the application of the electric power is terminated and an alloy target in which the application of the electric power is initiated is preferably set to 5 microseconds or more and 20 microseconds or less.

Further, to increase the ionization rate of the target component, three or more TiSi-based alloy targets are preferably used.

Further, preferably, preliminary discharge is performed with an internal temperature of a furnace of a sputtering apparatus set to 430° C. or higher, a flow rate of a nitrogen gas introduced into the furnace is set to 60 sccm or more, and a flow rate of argon gas is set to 70 sccm or more and 200 sccm or less.

Further, an internal pressure of the furnace of the sputtering apparatus is preferably set to 0.5 Pa to 0.7 Pa.

By coating the tool with a hard coating under the above conditions, content rates of oxygen and argon are reduced in the hard coating, and a content rate of nitrogen is easily increased. Further, to set the hard coating to a NaCl type crystal structure and a microstructure having high crystallinity, a negative bias voltage applied to a base of the tool is preferably controlled in a range of −55 V to −20 V.

The coated cutting tool of the present embodiment can be used in cutting tools for cutting, for instance, high hardness steel, stainless steel, heat resistant steel, cast steel, and carbon steel. To be specific, the coated cutting tool of the present embodiment can be used in an aspect of a ball end mill, a square end mill, a radius end mill, a multi-flute end mill, an insert, a drill, a cutter, a broach, a reamer, a hob, a router, or the like.

EXAMPLES

Hereinafter, the present invention will be described more specifically by examples and comparative examples, but the present invention is not limited to the following examples.

Examples

<Tool>

As a tool, a 4-blade square end mill (a tool radius of 3 mm, and available from Mitsubishi Hitachi Tool Engineering, Ltd.) made of a superhard alloy having a composition of WC (bal.), Co (8.0% by mass), Cr (0.5% by mass), and Ta (0.3% by mass), a WC average particle size of 0.5 μm, and hardness of 93.6 HRA (Rockwell hardness and a value measured according to JIS G 0202) was prepared.

In Examples 1 to 5 and Reference Example 1, a sputtering apparatus in which six sputtering vaporization sources could be mounted was used. Among these vaporization sources, three AlTi-based alloy targets and three TiSi-based alloy targets were installed in the apparatus as the vaporization sources. The targets having a diameter of 16 cm and a thickness of 12 mm as dimensions were used.

The tool was fixed to a sample holder in the sputtering apparatus, and was connected to a bias power supply. The bias power supply had a structure in which a negative bias voltage was applied to the tool independently of the target. The target rotated twice per minute, and revolved via a fixing jig and the sample holder. A distance between the tool and the target surface was set to 100 mm.

Ar and $N_2$ were used as introduction gases, and the introduction gases were introduced from gas supply ports provided in the sputtering apparatus.

<Bombardment Treatment>

First, before the tool is coated with the hard coating, bombardment treatment was performed on the tool in the following order.

The tool was heated for 30 minutes in a state in which the internal temperature in the furnace reached 430° C. by a heater in the sputtering apparatus. Afterward, the furnace of the sputtering apparatus was exhausted in a vacuum, and an internal pressure in the furnace was set to $5.0\times10^{-3}$ Pa or less. An Ar gas was introduced into the furnace of the sputtering apparatus, and the internal pressure in the furnace was adjusted to 0.8 Pa. A direct current bias voltage of −170 V was applied to the tool, and thereby cleaning (bombardment treatment) of the tool caused by Ar ions was performed.

<Formation of Intermediate Coating>

Next, the tool was coated with an intermediate coating of AlTiN in the following order.

An Ar gas was introduced into the furnace of the sputtering apparatus at 160 sccm while holding an internal temperature of the furnace at 430° C., and then an $N_2$ gas was introduced at 120 sccm to set an internal pressure of the furnace to 0.60 Pa. When a direct current bias voltage of −60 V was applied to the tool, a discharge time per one period of the electric power applied to the alloy target containing Al and Ti was 4.0 milliseconds and the alloy target to which the electric power is applied was replaced, an intermediate coating having a thickness of about 1.5 μm was coated on a surface of the tool by continuously applying the electric power while replacing three AlTi-based alloy targets in a state in which a time for which the electric power was simultaneously applied to both an alloy target in which the application of the electric power was terminated and an alloy target in which the application of the electric power was initiated was set to 10 microseconds. In this case, a maximum power density of electric power pulses was set to 1.5 kW/cm², and an average power density was set to 0.37 kW/cm².

<Formation of Hard Coating>

Next, in Examples 1 to 3, Example 5, and Reference Example 1, the hard coating was coated on the intermediate coating in the following order.

An Ar gas was introduced into the furnace of the sputtering apparatus at 160 sccm while holding an internal temperature of the furnace at 430° C., and then an $N_2$ gas was introduced at 80 sccm to set an internal pressure of the furnace to 0.52 Pa. When a direct current bias voltage of −40 V was applied to the tool, a discharge time per one period of the electric power applied to the alloy target containing Al and Ti was 4.0 miliseconds and the alloy target to which the electric power is applied was replaced, a hard coating having a thickness of about 1.5 μm was coated on a surface of the intermediate coating by continuously applying the electric power while replacing three TiSi-based alloy targets in a state in which a time for which the electric power was simultaneously applied to both an alloy target in which the application of the electric power was terminated and an alloy target in which the application of the electric power was initiated was set to 10 microseconds. In this case, a maximum power density of electric power pulses was set to 1.5 kW/cm², and an average power density was set to 0.37 kW/cm².

Except that, in the case of Example 4, an Ar gas was introduced into the furnace of the sputtering apparatus at 160 sccm, and then a $N_2$ gas was introduced at 100 sccm to set an internal pressure of the furnace to 0.57 Pa, a hard coating having a thickness of about 1.5 μm was coated on the intermediate coating under the same conditions as Examples 1 to 3, Example 5, and Reference Example 1.

In the case of Example 5, a polishing agent was jetted before the hard coating was coated, and grinding marks of the tool were removed. After the hard coating was coated, the polishing agent was further jetted to perform edge treatment. In the case of Examples 1 to 4 and Reference Example 1, only after the hard coating was coated, the polishing agent was jetted to perform edge treatment.

In the case of Comparative Examples 1 and 2, a sample coated by an arc ion plating method were prepared.

An arc ion plating apparatus in which one AlTi-based alloy target and one TiSi-based alloy target were provided as the vaporization sources was used for coating formation. The targets having a diameter of 10.5 cm and a thickness of 16 mm as dimensions were used.

As in Examples 1 to 5 and Reference Example 1, the tool was cleaned by Ar ions.

The arc ion plating apparatus was subjected to vacuum evacuation at an internal pressure of the furnace of $5.0 \times 10^{-3}$ Pa or less, and a $N_2$ gas was introduced such that an internal temperature of the furnace was set to 430° C. and an internal pressure of the furnace become 4.0 Pa. A direct current bias voltage of −50V was applied to the tool, and an electric current of 150 A was supplied to the AlTi-based alloy target, so that a surface of the sample was coated with an intermediate coating having a thickness of about 1.5 μm.

Next, a $N_2$ gas was introduced such that an internal pressure of the furnace become 4.0 Pa while maintaining an internal temperature of the furnace at 430° C. A bias voltage of −50V was applied to the tool, and an electric current of 150 A was supplied to the TiSi-based alloy target, so that a hard coating having a thickness of about 1.5 μm was coated.

In the case of Comparative Example 1, after the hard coating was coated, a polishing agent was jetted to perform edge treatment.

<Coating Composition>

A composition of the hard coating was measured using an electron probe micro-analyzer (DCA-8500F available from JEOL Ltd.). To be specific, the composition of the hard coating was measured by wavelength dispersive spectrometry electron probe microanalysis (WDS-EPMA) attached to the electron probe micro-analyzer. A sample was subjected to specular working by a ball end mill for physical property evaluation. Measurement conditions were an accelerating voltage of 10 kV, an irradiation current of $5 \times 10^{-8}$ A, and an acquisition time of 10 seconds, and five points were measured in a range in which an analysis region had a diameter of 1 μm, and a content rate of metals of the hard coating and a content rate of Ar in the total of metal components and non-metal components were obtained from an average value of the measured values.

<Crystal Structure and Grain Size>

A crystal structure of the hard coating was confirmed under measurement conditions having a pipe voltage of 45 kV, a pipe current of 40 mA, an X-ray source of Cukα (λ=0.15405 nm), and 2θ of 20 to 80 degrees using an X-ray diffractometer (EMPYREA available from PaNalytical Co., Ltd.). Further, an average grain size of the hard coating was measured from full-width at half maximum of diffraction peak intensity of (200) plane of the hard coating. Further, in a case where the diffraction peak intensity of the (200) plane of the hard coating was defined as I(200) and diffraction peak intensity of (111) plane of the hard coating was defined as I(111), I(200)/I(111) was calculated.

<Surface Roughness>

In the hard coating with which a flank was coated, an arithmetic mean height Sa, a maximum height Sz, skewness (Ssk), and an arithmetic mean peak curvature Spc (1/mm) were based on the provisions of ISO 25178, were observed with a cutoff value of 0.25 mm at 50 magnifications using a shape analysis laser microscope (VK-X250) that was available from KEYENCE Co., Ltd., and were obtained from an average of measurement values obtained by measuring three regions of 60 μm×100 μm.

TABLE 1

| Coating composition | Content percentage of Ar [at %] | Crystal structure showing maximum strength | I (200)/ I (111) | Average grain size [nm] | Arithmetic mean height (Sa) [μm] | Maximum height (Sz) [μm] | Arithmetic mean peak curvature (Spc) [1/mm] | Skewness (Ssk) | Maximum wear width of flank [μm] | Sample No |
|---|---|---|---|---|---|---|---|---|---|---|
| (Ti88Si12) N | 0.06 | fcc (200) | 4 | 9 | 0.04 | 1.97 | 2088 | −2.75 | 38 | Example 1 |
| (Ti88Si12) N | 0.06 | fcc (200) | 4 | 9 | 0.05 | 1.54 | 2987 | −1.45 | 40 | Example 2 |
| (Ti88Si12) N | 0.06 | fcc (200) | 4 | 9 | 0.05 | 1.85 | 2863 | −0.89 | 39 | Example 3 |
| (Ti88Si12) N | 0.07 | fcc (200) | 5 | 8 | 0.04 | 1.03 | 1988 | −1.09 | 35 | Example 4 |
| (Ti88Si12) N | 0.06 | fcc (200) | 4 | 9 | 0.04 | 1.21 | 4600 | −0.37 | 36 | Example 5 |
| (Ti88Si12) N | 0.06 | fcc (200) | 4 | 9 | 0.09 | 2.70 | 7060 | −0.16 | 46 | Reference Example 1 |
| (Ti88Si12) N | 0 | fcc (200) | 7 | 7 | 0.06 | 3.33 | 3143 | −4.68 | 47 | Comparative Example 1 |
| (Ti88Si12) N | 0 | fcc (200) | 7 | 7 | 0.12 | 5.53 | 8296 | 1.04 | 50 | Comparative Example 2 |

<Measurement of Atomic Concentration Distribution of Depth Direction from Surface of Hard Coating>

With regard to the coated cutting tools of examples and comparative examples, atomic concentration distribution of a depth direction was measured from the surface of the hard coating in a depth direction using a scanning X-ray photoelectron spectroscope (Quantum-2000 available from Ulvac-Phi Inc.). An analysis used an X-ray source of AlKα, an analysis region having a diameter of 20 μm, and an electron neutralization gun, and the measurement was performed. To measure the atomic concentration distribution of the depth direction of the hard coating, etching was performed at a speed of 10 nm/min in terms of $SiO_2$ using an Ar ion gun, an analysis of the coating composition was performed at each etching of 20 nm, and a depth up to 200 nm was analyzed from the surface of the hard coating.

The total of the content rates of carbon, nitrogen, oxygen, silicon, and titanium was set to 100 at %, and the analysis of the coating composition was performed. Metallic elements (including metalloid elements) other than these elements were not contained in the hard coating.

The coated cutting tools of Comparative Examples 1 and 2 coated with the hard coating by an arc ion plating method had high content rates of oxygen and carbon and a content rate of nitrogen of less than 50.0 at % in a thickness direction of the hard coating. On the other hand, the coated cutting tools of Examples 1 to 5 had low content rates of oxygen and carbon and a content rate of nitrogen of not less than 50.0 at % in the thickness direction of the hard coating, and were presumed that a nitride was sufficiently formed compared to the hard coating coated by the arc ion plating method.

The coated cutting tools of Examples 1 to 5 had low content rates of oxygen and carbon and a content rate of nitrogen of not less than 50.0 at % even in places in which the depth from the surface of the hard coating is deeper than 200 nm. On the other hand, the coated cutting tools of Comparative Examples 1 and 2 coated with the hard coating by the arc ion plating method had a lot of oxygen and carbon and a content rate of nitrogen of less than 50.0 at % in the places in which the depth from the surface of the hard coating is deeper than 200 nm.

The coated cutting tool of Example 4 had a content rate of nitrogen of not less than 51.0 at % in the thickness direction of the hard coating, and was presumed that the nitride was sufficiently formed compared to the other examples.

Figure 2:
FIG. 2 is an example of a surface observation photograph by a laser microscope (at a magnification of 50) in Example 5.
Figure 3:
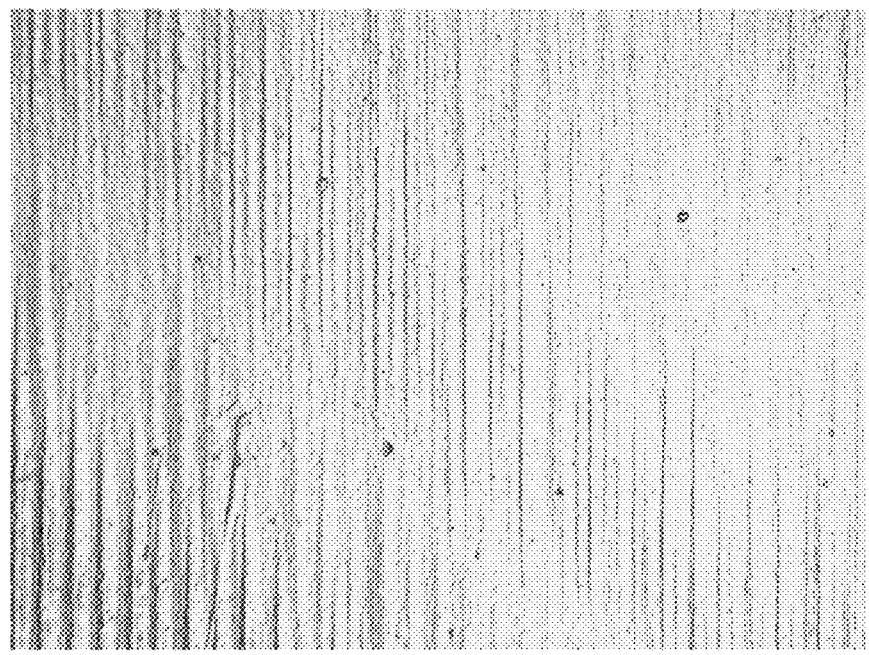
FIG. 3 is an example of a surface observation photograph by a laser microscope (at a magnification of 50) in Reference Example 1

In the coated cutting tools of Examples 1 to 5, a polishing agent is jetted to perform edge treatment after the coated cutting tools was coated with a hard coating by a sputtering method, and a value of the arithmetic mean peak curvature Spc become small compared to the coated cutting tool of Reference Example 1 in which the edge treatment was not performed. An example of a surface observation photograph of the coated cutting tool of Example 3 taken by a laser microscope (of 50 magnifications) is illustrated in FIG. 1. An example of a surface observation photograph of the coated cutting tool of Example 5 taken by a laser microscope (of 50 magnifications) is illustrated in FIG. 2. An example of a surface observation photograph of the coated cutting tool of Reference Example 1 taken by a laser microscope (of 50 magnifications) is illustrated in FIG. 3.

It was confirmed from FIG. 2 that the coated cutting tool of Example 5 in which the edge treatment was performed before coating of the hard coating did not have nearly parallel grinding marks formed in a constant direction. On the other hand, it was confirmed from FIGS. 1 and 3 that the coated cutting tools of Example 3 and Reference Example 1 in which the edge treatment was not performed before coating of the hard coating had the nearly parallel grinding marks formed in the constant direction.

In the coated cutting tool of Comparative Example 1, edge treatment was performed after the coated cutting tool was coated with a hard coating by an arc ion plating method, and a value of the arithmetic mean peak curvature Spc was substantially the same as those of the coated cutting tools of Examples 1 to 5, but the maximum height Sz was higher than those of the coated cutting tools of Examples 1 to 5. In the coated cutting tool of Comparative Example 1, droplets were removed, and thus a value of the skewness (Ssk) also increased toward a negative side.

In the coated cutting tool of Comparative Example 2, edge treatment was not performed after the coated cutting tool was coated with a hard coating by an arc ion plating method, and both the arithmetic mean peak curvature Spc and the maximum height Sz become large compared to the coated cutting tools of Examples 1 to 5. Further, in the coated cutting tool of Comparative Example 2, may droplets were present on a hard coating, and a value of the skewness (Ssk) also become 0 or more.

Figure 4:
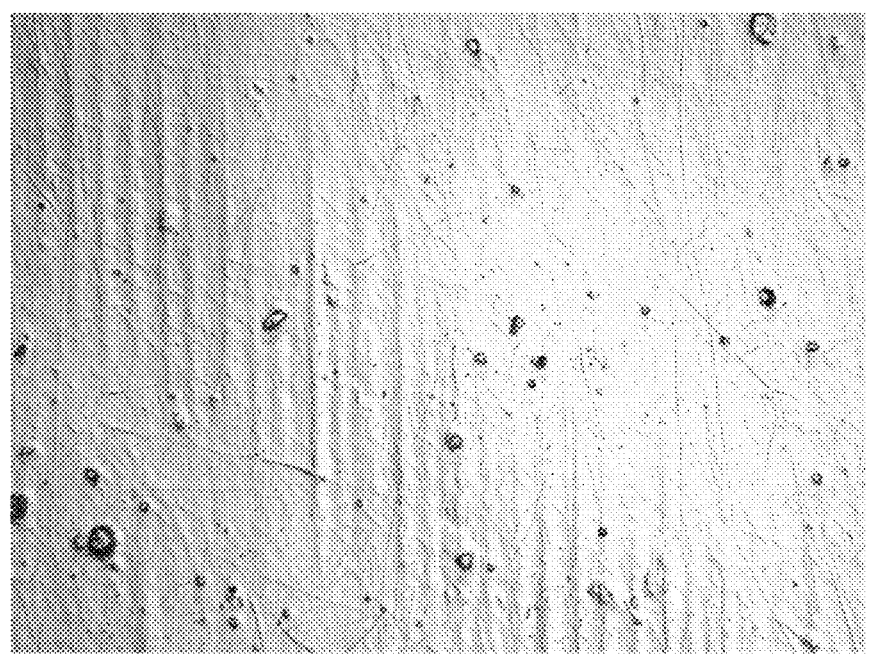
FIG. 4 is an example of a surface observation photograph by a laser microscope (at a magnification of 50) in Comparative Example 1.
Figure 5:
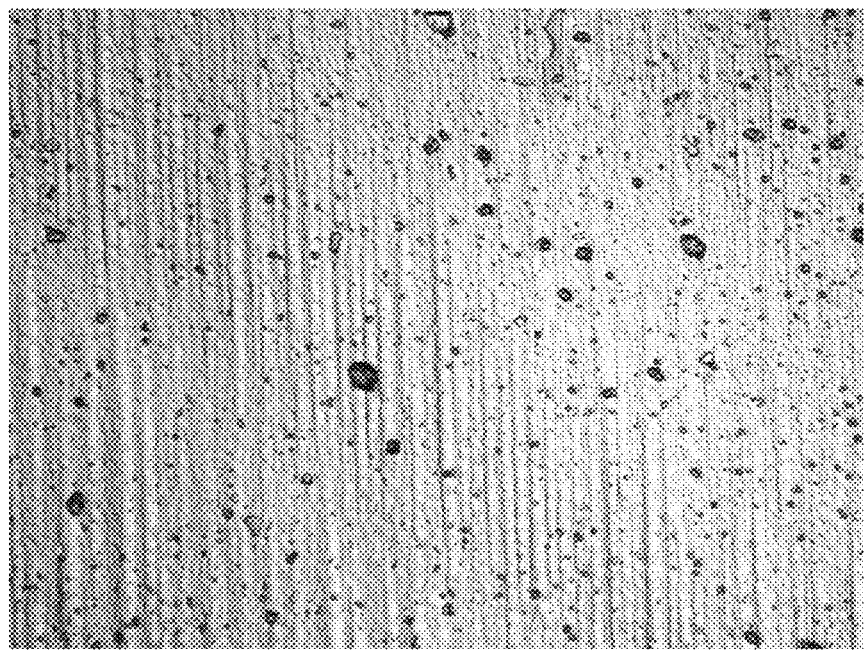
FIG. 5 is an example of a surface observation photograph by a laser microscope (at a magnification of 50) in Comparative Example 2.

An example of a surface observation photograph of the coated cutting tool of Comparative Example 1 taken by a laser microscope (of 50 magnifications) is illustrated in FIG. 4. An example of a surface observation photograph of the coated cutting tool of Comparative Example 2 taken by a laser microscope (of 50 magnifications) is illustrated in FIG. 5. In the coated cutting tools of Comparative Examples 1 and 2, since the edge treatment was not performed before coating of the hard coating, grinding marks were confirmed from FIGS. 4 and 5. Further, in the coated cutting tools of Comparative Examples 1 and 2, since the coated cutting tools were coated with the hard coating by the arc ion plating method, many droplets were confirmed.

<Cutting Test>

A cutting test was performed using the coated cutting tool that was made. Cutting conditions are as follows.
(Conditions) wet machining
Tool: 4-blade superhard square end mill
Model number; EPP4030, tool radius of 1.5 mm
Cutting method: Bottom surface cutting
Workpiece: STAVAX (52 HRC) (available from Bahler Uddeholm Co., Ltd.)
Depth of cut: Axial direction of 3.0 mm, and radial direction of 0.2 mm
Cutting speed: 50.0 m/min
One-blade feed rate: 0.015 mm/blade
Cutting fluid: Water-soluble emersion pressure feed
Cutting distance: 30 m Maximum wear widths of the coated cutting tools of Examples 1 to 5 and Reference Example 1 which were coated with the hard coating by the sputtering method were curbed compared to maximum wear widths of the coated cutting tools of Comparative Examples 1 and 2 which were coated with the hard coating by the arc ion plating method. Further, the coated cutting tools of Examples 1 to 5 were small in deviation of tool wear and had a tendency toward more stability, compared to the coated cutting tool of Reference Example 1.

INDUSTRIAL APPLICABILITY

The coated cutting tool according to the present invention has excellent durability in cutting machining of high hardness steel or the like, and is extremely useful.

The invention claimed is:
1. A coated cutting tool having a hard coating on a surface thereof,
wherein the hard coating is a nitride, contains titanium (Ti) at 70 at % or more and 95 at % or less and silicon (Si) at 5 at % or more and 30 at % or less with respect to a total amount of metallic elements (including metalloid elements), and argon (Ar) at 0.05 at % or more and 0.20 at % or less with respect to a total amount of metallic elements (including metalloid elements) and non-metallic elements, the hard coating has a NaCl type crystal structure, exhibits maximum diffraction peak intensity in the (200) plane due to the NaCl type crystal structure, and has an average grain size of 5 nm or more and 30 nm or less, when 100 at % is defined as a total of content rates of metallic elements (including metalloid elements), nitrogen, oxygen, and carbon in a composition at intervals of 20 nm from a depth of 20 nm to a depth of 200 nm from the surface of the hard coating, the content rate of nitrogen is 50.0 at % or more, and a flank of the coated cutting tool has an arithmetic mean height (Sa) of 0.1 μm or less, a maximum height (Sz) of 2.0 μm or less, and an arithmetic mean peak curvature (Spc) (1/mm) value of 5,000 or less, all of which are as defined by ISO 25178.

2. The coated cutting tool according to claim 1, wherein the flank does not have nearly parallel grinding marks formed in a constant direction.

3. The coated cutting tool according to claim 1, wherein an intermediate coating is provided between the tool and the hard coating.

4. The coated cutting tool according to claim 1, wherein a value of skewness (Ssk) as defined by ISO 25178 is 4.0 or more and 0 or less in the flank.

5. The coated cutting tool according to claim 2, wherein an intermediate coating is provided between the tool and the hard coating.

6. The coated cutting tool according to claim 2, wherein a value of skewness (Ssk) as defined by ISO 25178 is 4.0 or more and 0 or less in the flank.

7. The coated cutting tool according to claim 3, wherein a value of skewness (Ssk) as defined by ISO 25178 is −4.0 or more and 0 or less in the flank.

8. The coated cutting tool according to claim 5, wherein a value of skewness (Ssk) as defined by ISO 25178 is −4.0 or more and 0 or less in the flank.

* * * * *